(12) United States Patent
Lin et al.

(10) Patent No.: US 10,514,131 B2
(45) Date of Patent: Dec. 24, 2019

(54) LIGHT-EMITTING APPARATUS

(71) Applicant: EPISTAR CORPORATION, Hsinchu (TW)

(72) Inventors: Chun-Wei Lin, Hsinchu (TW); Shuo-Chieh Kan, Hsinchu (TW); Chiu-Lin Yao, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 635 days.

(21) Appl. No.: 15/203,343

(22) Filed: Jul. 6, 2016

(65) Prior Publication Data
US 2018/0010738 A1 Jan. 11, 2018

(51) Int. Cl.
| *F21K 9/20* | (2016.01) |
| *F21K 9/61* | (2016.01) |
| *F21K 9/90* | (2016.01) |
| *F21S 41/24* | (2018.01) |
| *H01L 33/48* | (2010.01) |
| *H01L 33/62* | (2010.01) |

(52) U.S. Cl.
CPC ............. *F21K 9/20* (2016.08); *F21K 9/61* (2016.08); *F21K 9/90* (2013.01); *H01L 33/483* (2013.01); *H01L 33/62* (2013.01); *F21S 41/24* (2018.01); *H01L 2933/0066* (2013.01)

(58) Field of Classification Search
CPC ............. H01L 33/62; H01L 2933/0066; H01L 33/483; F21K 9/20; F21K 9/61; F21K 41/24; F21K 9/90; F21S 41/24
See application file for complete search history.

(56) References Cited

U.S. PATENT DOCUMENTS

| 9,054,072 | B2 | 6/2015 | Yamamoto | |
| 2006/0169999 | A1* | 8/2006 | Park | H01L 33/62 |
| | | | | 257/99 |
| 2011/0074276 | A1* | 3/2011 | Kuroki | H01L 33/486 |
| | | | | 313/483 |
| 2011/0193109 | A1* | 8/2011 | Loh | F21V 29/70 |
| | | | | 257/89 |
| 2012/0175657 | A1 | 7/2012 | Chen et al. | |
| 2013/0292812 | A1 | 11/2013 | Seo et al. | |
| 2015/0362133 | A1* | 12/2015 | Lin | F21K 9/90 |
| | | | | 362/382 |
| 2016/0020577 | A1* | 1/2016 | Sakai | H01S 5/02212 |
| | | | | 362/259 |
| 2016/0343918 | A1* | 11/2016 | Yamada | H01L 33/54 |

* cited by examiner

*Primary Examiner* — Marcos D. Pizarro
*Assistant Examiner* — Antonio B Crite
(74) *Attorney, Agent, or Firm* — Ditthavong & Steiner, P.C.

(57) ABSTRACT

A light-emitting apparatus includes a supporting element, a light-emitting device, and a connecting pin. The light-emitting device has a pair of conductive pads and is disposed on the supporting element. The connecting pin is inserted from the side surface of the supporting element and electrically connected to one of the conductive pads. The topmost surface of the supporting element is lower than the top surface of the light-emitting device.

16 Claims, 6 Drawing Sheets

LIGHT-EMITTING APPARATUS

TECHNICAL FIELD

The present disclosure relates to a light-emitting apparatus, and in particular to a light-emitting apparatus having a supporting element molded with a bended connecting pin.

DESCRIPTION OF THE RELATED ART

Light-emitting device using light-emitting diode (LED) is gradually taking the place of traditional incandescent light because the LED is energy saving, environmental friendly, long life time, compact, and so on. Various light-emitting devices, such as a device using a single or multiple chips as a light source, are developed in this trend.

Accordingly, using LEDs in automotive lamp can provide significant energy savings, increased lamp life, smaller lamp size, and flexibility in the design. For these reasons, automotive manufacturers are increasingly interested in lamp designs, such as headlamps, tail lamps, and indicator lamps.

The present invention can be applied in an automotive lamp assembly for an automotive vehicle. The present invention relates to a light apparatus including a holder and a light-emitting device disposed thereon. The appearance of the holder is slim. The holder includes the bonding pads for light-emitting device bonded on. The present invention also provides a simple manufacturing process of the light apparatus.

SUMMARY OF THE DISCLOSURE

A light-emitting apparatus includes a supporting element, a light-emitting device, and a connecting pin. The light-emitting device has a pair of conductive pads and is disposed on the supporting element. The connecting pin is inserted from the side surface of the supporting element and electrically connected to one of the conductive pads. The topmost surface of the supporting element is lower than the top surface of the light-emitting device.

DETAILED DESCRIPTION OF THE EMBODIMENTS

The drawings illustrate the embodiments of the application and, together with the description, serve to illustrate the principles of the application. The same name or the same reference numeral given or appeared in different paragraphs or figures along the specification should has the same or equivalent meanings while it is once defined anywhere of the disclosure. The thickness or the shape of an element in the specification can be expanded or narrowed.

Figure 1A:
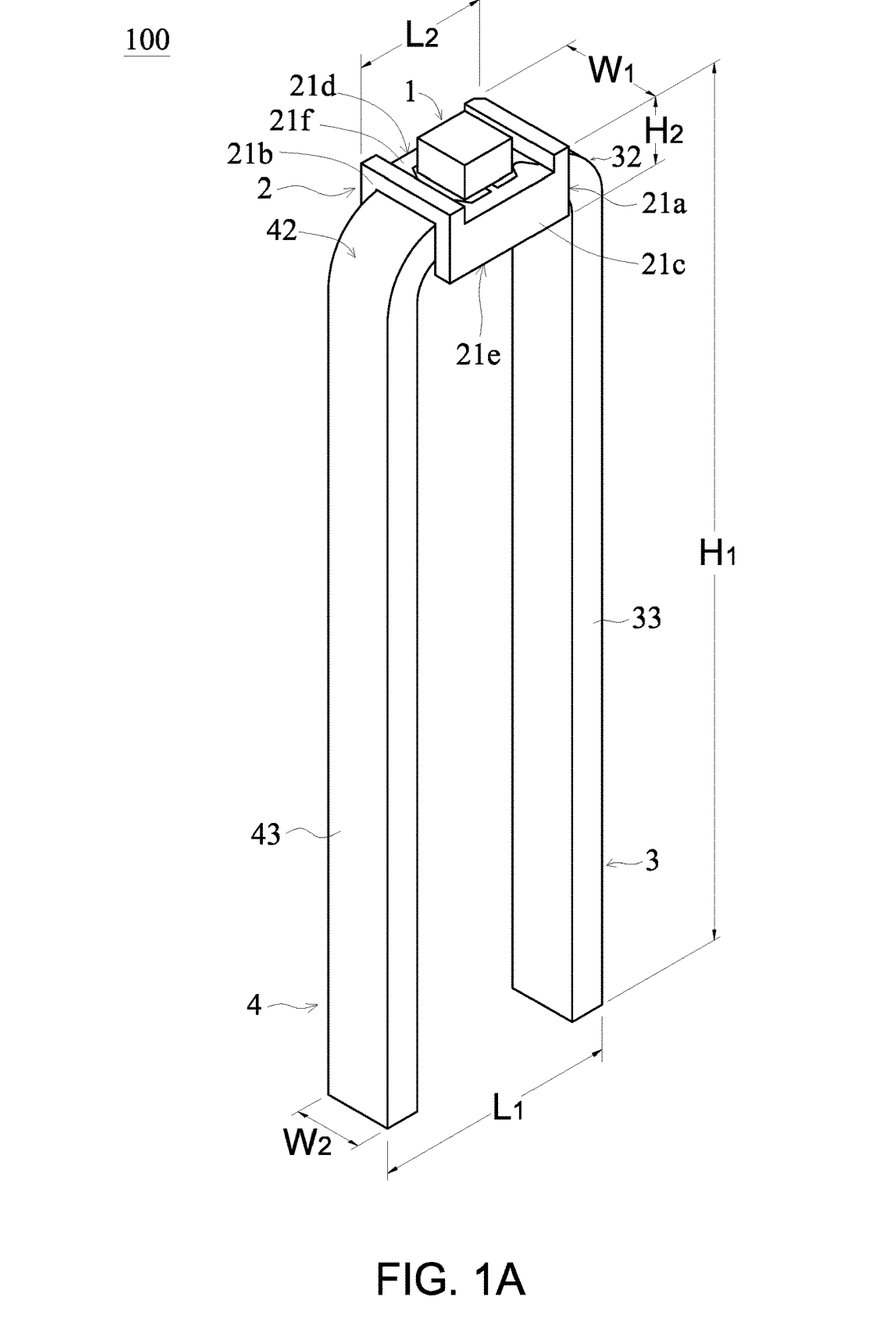
FIG. 1A shows a perspective view of a light-emitting apparatus in accordance with an embodiment of the present disclosure.

FIG. 1A shows a drawing of a light-emitting apparatus 100 in accordance with the present disclosure. The light-emitting apparatus 100 includes a light-emitting device 1, a supporting element 2, and connecting pins 3, 4. The supporting element 2 can support and/or engage with the connecting pins 3, 4. The supporting element 2 has a right surface 21a, a left surface 21b that faces the right surface 21a, a front surface 21c that connects the right surface 21a and the left surface 21b, a rear surface 21d that faces the front surface 21c, a bottom surface 21e, and a top surface 21f that faces the bottom side 21e. The bottom surface 21e connects the right surface 21a, the left surface 21b, the front surface 21c, and the rear surface 21d. The light-emitting device 1 is disposed on the top surface 21f of the supporting element 2 and has a pair of conductive pads (not shown) which face and electrically contact the connecting pins 3, 4. A portion of lateral sides of the light-emitting device 1 which face the right surface 21a and the left surface 21b are sandwiched by the supporting element 2. In other words, the topmost surface of the supporting element 2 is lower than the top surface of the light-emitting device 1. In another embodiment, the topmost surface of the supporting element 2 is higher than, or has the same elevation as the top surface of the light-emitting device 1. The lateral sides of the light-emitting device 1 which face the front surface 21c and the rear surface 21d are exposed to a free space without blocking by other structure of the supporting element 2. The connecting pins 3, 4 can be inserted from the right surface 21a and the left surface 21b of the supporting element 2, and electrically connected to the conductive pads of the light-emitting device 1, respectively. The connecting pins 3, 4 can electrically connect to a power supply (not shown) to energize the light-emitting device 1 and to dissipate heat generated from the light-emitting device 1. The light-emitting device 1 can be powered to emit light via connecting to a power supply (not shown) through the connecting pins 3, 4.

The connecting pin 3 has a bending portion 32 and an extending portion 33. The connecting pin 4 has a bending portion 42 and an extending portion 43. The bending portion 32 extends from the right surface 21a and connects to the extending portion 33. The bending portion 42 extends from the left surface 21b and connects to the extending portion 43. The extending portion 33 extends from the bending portion 32 and downwardly moves in a direction far away from the supporting element 2. For example, the extending portion 33 downwardly extends in a direction substantially perpendicular to a bottom surface 21e of the supporting element 2. The extending portion 43 also extends from the bending portion 42 and downwardly moves in the same direction as the extending portion 33. In one embodiment, the extending portions 33, 43 are substantially perpendicular to the bottom surface 21e of the supporting element 2.

The light-emitting apparatus 100 has a length L1, a width W1, and a height H1. L1 is 4~25 mm, W1 is 2~15 mm, H1 is 20~35 mm, for example L1=5 mm, W1=3 mm, H1=25 mm. The supporting element 2 has a length L2, and a height H2, L2 is 3.5~6 mm, H2 is 1.5~4 mm, for example L2=4 mm, and H2=2 mm. The width of the supporting element 2 is substantially same as the width of light-emitting apparatus 100. In other words, the supporting element 2 also has a width of W1. The difference between L1 and L2 is less than 20 mm. A ratio of H1/H2 is of about 5~15. The connecting pins 3, 4 have widths W2, W2 is of about 1~10 mm, and W2<W1. The difference of W1 and W2 is less than 5 mm, and W1/W2 is of about 2~10. For example, W1=3 mm, W2=1 mm.

Figure 1B:
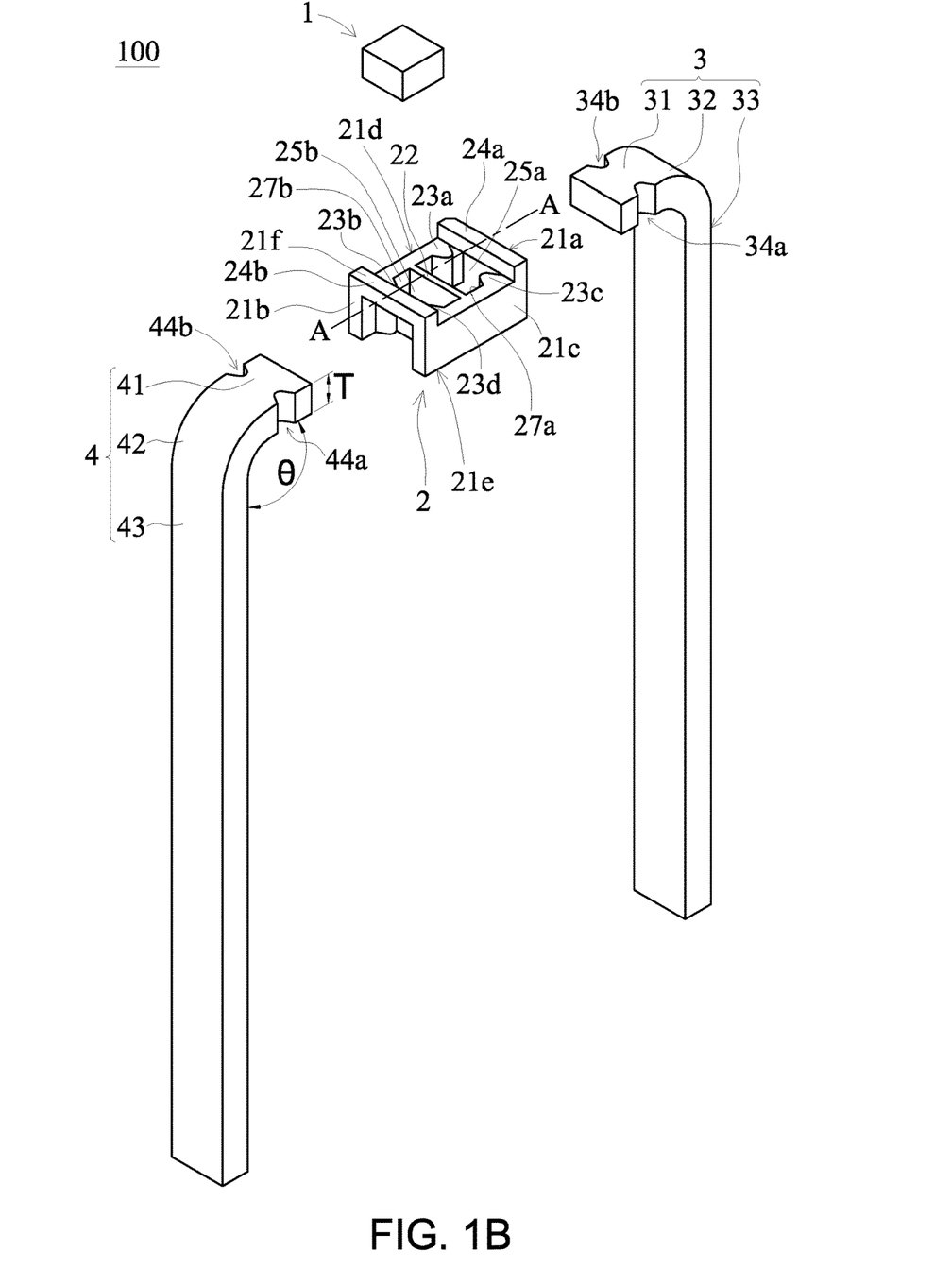
FIG. 1B shows an exploded view of a light-emitting apparatus in accordance with an embodiment of the present disclosure.

FIG. 1B shows an exploded view of the light-emitting apparatus 100. The connecting pin 3 has an inserting portion 31. The connecting pin 4 has an inserting portion 41. The inserting portion 31, 41 are arranged to insert into the supporting element 2. An angle θ is between the inserting portion 41 and the extending portion 43, and the angle θ is not equal to 180°, preferably, 45°<θ<135°. In one embodiment, the angle θ is substantially equal to 90°. The inserting portion 41 is substantially perpendicular to the extending portion 43. The bending portion 42 bridges the inserting portion 41 and the extending portion 43. The inserting portion 31, the bending portion 32, and the extending portion 33 have a similar arrangement to the inserting portion 41, the bending portion 42, and the extending portion 43. The inserting portions 31, 41 are engaged with the supporting element 2.

Figure 2A:
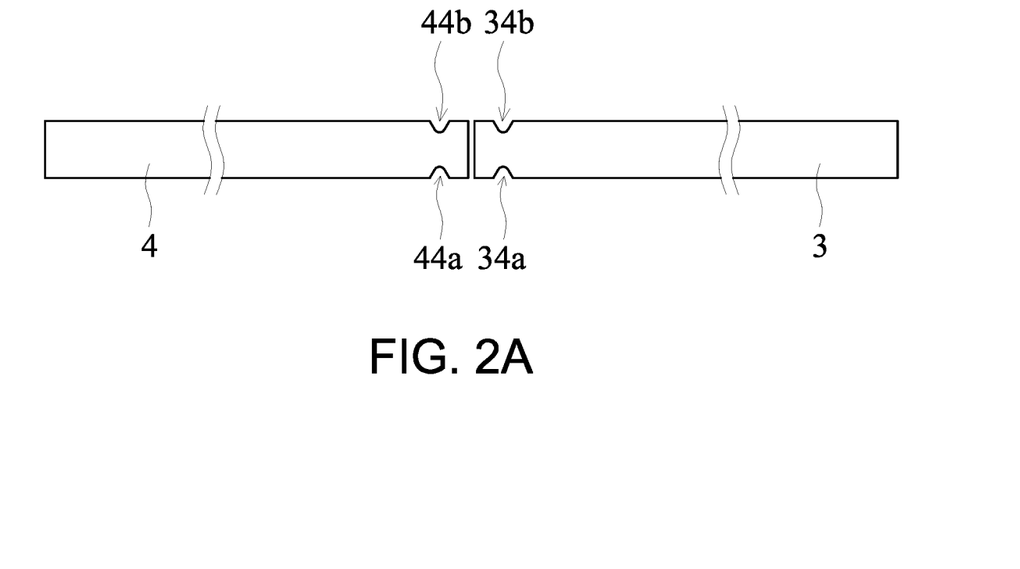
FIGS. 2A-2D show steps of manufacturing a light-emitting apparatus in accordance with an embodiment of the present disclosure.
Figure 2B:
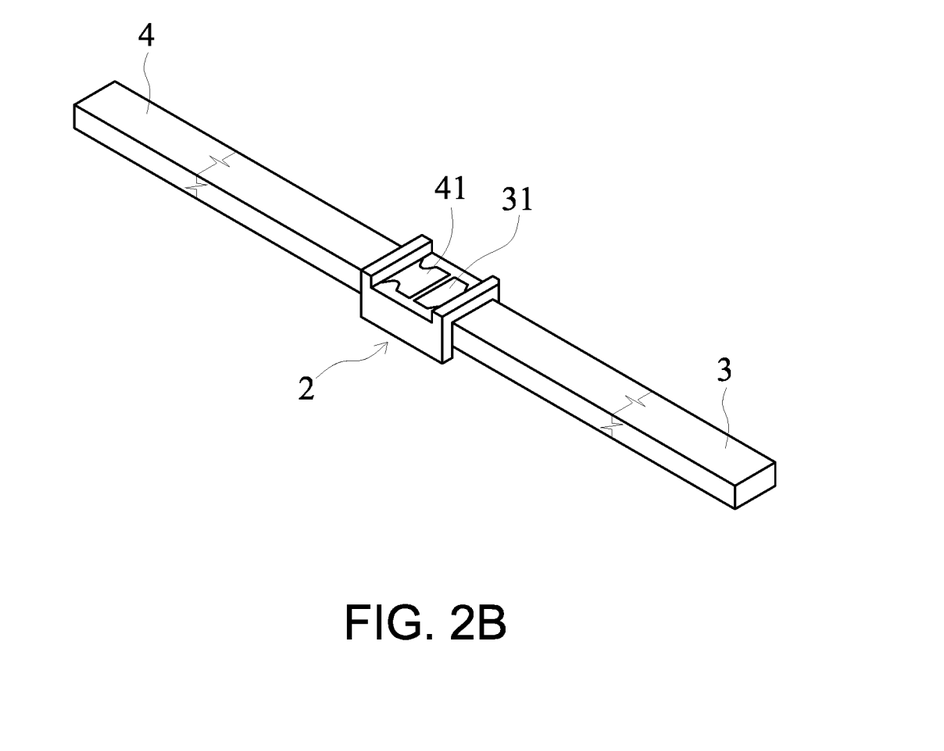

The inserting portion 31 has notches 34a and 34b formed on two opposite lateral sides of the inserting portion 31. The inserting portion 41 also has notches 44a and 44b formed on two opposite lateral sides of the inserting portion 41. The notches 34a, 34b, 44a, and 44b are V- or U-shaped cuts (for example, in a top view of the connecting pin 3 or 4, as shown in FIG. 2A) formed on the side surfaces of the inserting portions 31 and 41. In other words, the notches 44a and 44b face to each other by a distance which is larger than zero. In another embodiment, the notches 44a, 44b are blind holes indented on the side surfaces of the inserting portion 42 without exposing on the top and bottom surfaces of the inserting portion 41. The inserting portion 41, bending portion 42, and the extending portion 43 are preferably constructed as a one-piece object which is made of one or more kinds of materials and has a uniform thickness. The notches 34a and 34b are formed on the connecting pin 3 in an arrangement identical or similar to the notches 44a and 44b on the connecting pin 4. The connecting pins 3, 4 are made of a flexible metallic material which has good ductility, high electrical conductivity, and good thermal conductivity, such as Cu, Al, brass with Ni-plating, or phosphor bronze with Al-plating. The connecting pins 3, 4 have a thickness T, T is 0.5~3 mm and T<H2. The difference of T and H2 is less than 5 mm, and a ratio of H2 to T is 5~1.5, for example T=1 mm, H2=2 mm.

Figure 1C:
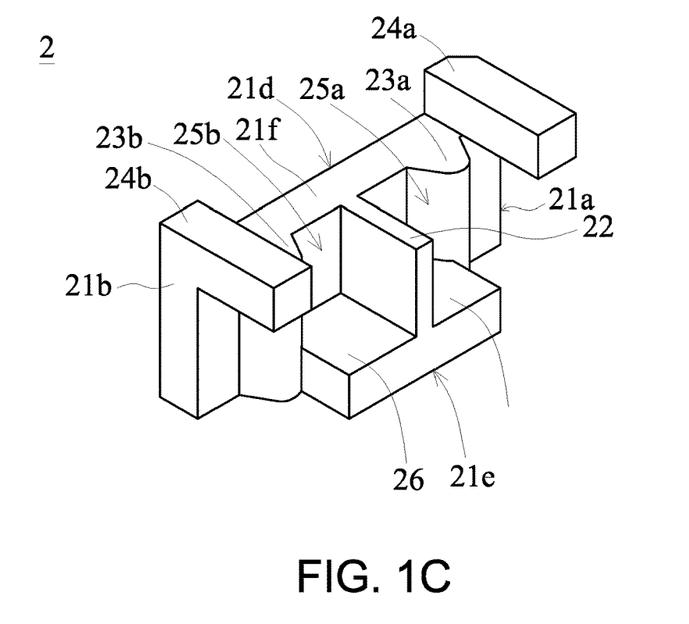
FIG. 1C shows a cross-sectional view of the supporting element in accordance with an embodiment of the present disclosure.
Figure 1D:
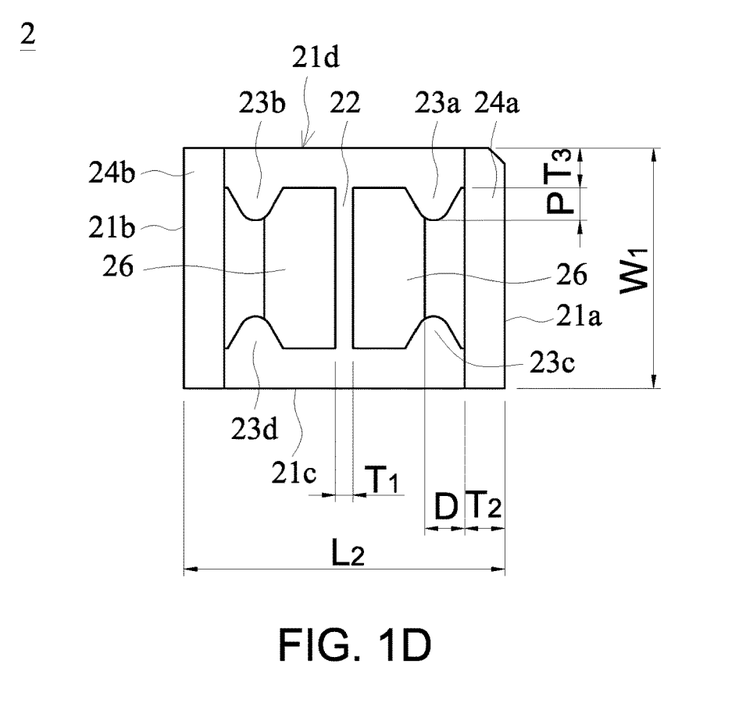
FIG. 1D shows a top view of a supporting element in accordance with an embodiment of the present disclosure.

FIG. 1C is a cross sectional view taken along A-A line in FIG. 1B. FIG. 1D is a top view of the supporting element 2. As shown in FIGS. 1B-1D. The supporting element 2 has a first inner surface 27a which is close to the front surface 21c, and a second inner surface 27b which is close to the rear surface 21d. The supporting element 2 includes two separated empty spaces, a right space 25a and a left space 25b, which are separated from each other by a stopper 22. The stopper 22 laterally extends from the first inner surface 27a to the second inner surface 27b and locates at about a middle part of the supporting element 2. The stopper 22 also extends from the top surface 21f to the bottom surface 21e of the supporting element 2. The right space 25a can accommodate the inserting portion 31. The left space 25b can accommodate the inserting portion 41.

The supporting element 2 has four knobs 23a, 23b, 23c, 23d. The knobs 23a, 23c are arranged in the right space 25a. The knobs 23b, 23d are arranged in the left space 25b. The knobs 23a, 23b extend from the second inner surface 27b toward the first inner surface 27a. The knobs 23c, 23d extend from the first inner surface 27a toward the second inner surface 27b. In more specific, the knobs 23a and 23c face to each other by a distance which is larger than zero, and the knobs 23b and 23d face to each other by a distance which is larger than zero. The knobs 23a, 23b, 23c, 23d extend from the top surface 21f to the bottom surface 21e of the supporting element 2. In an embodiment, in a top view, the apex of the knob 23a aligns with the apex of the knob 23c; the apex of the knob 23b aligns with the apex of the knob 23d. In another embodiment, the apex of the knob 23a doesn't align with the apex of the knob 23c; and/or the apex of the knob 23b doesn't align with the apex of the knob 23d. The knobs 23a, 23c have shapes which are complementary to the notches 34b, 34a of the connecting pin 3, respectively. The knobs 23b, 23d have shapes which are complementary to the notched 44b, 44a of the connecting pin 4, respectively. In a top view, the shape of the space 25a is complementary to the inserting portion 31 of the connecting pin 3; the shape of the space 25b is complementary to the inserting portion 41 of the connecting pin 4. In more specific, the contour of the inserting portion 31 of the connecting pin 3 is substantially complementary to the right space 25a; the contour of the inserting portion 41 of the connecting pin 4 is substantially complementary to the left space 25b. Therefore, the inserting portions 31, 41 (connecting pins 3, 4) can tightly assemble with supporting element 2. In one embodiment, the knobs 23a-23d have a shape of a semi-circle in the top view, but the present invention is not limited to the same.

As shown in FIG. 1B~1C, the supporting element 2 has two ridges 24a, 24b. The ridge 24a is formed around the right surface 21a and connects the front surface 21c and the rear surface 21d. The ridge 24b is formed around the left surface 21b and connects the front surface 21c and the rear surface 21d. The ridge 24a doesn't cover the knobs 23a, 23c and the stopper 22. The ridge 24b doesn't cover the knobs 23b, 23d and the stopper 22. In a side view (front or rear), the supporting element 2 has a larger height and a smaller inner height. The larger height is the distance from the bottom surface 21e of the supporting element 2 to the top surface of the ridge 24a or 24b. The smaller inner height is the distance from the bottom surface 21e of the supporting element 2 to the top surface of the supporting element 2 between the ridges 24a and 24b Hence, the top surface of the inserting portion 31 of the connecting pin 3 is exposed out of the supporting element 2 for bonding with one conductive pad (not shown) of the light-emitting device 1; the top surface of the inserting portion 41 of the connecting pin 4 is exposed out of the supporting element 2 for bonding with another conductive pad (not shown) of the light-emitting device 1. In another embodiment, the ridge 24a covers a portion of the knobs 23a, 23c; the ridge 24b covers a portion of the knobs 23b, 23d.

As shown in FIG. 1B~1D. The supporting element 2 has a base 26 formed between the knobs 23a, 23b, 23c, and 23d. The base 26 extends from the first inner surface 27a to the second inner surface 27b. In the top view, as shown in FIG. 1D, the base 26 doesn't extend to the right surface 21a and the left surface 21b. There is a gap between the base 26 and the ridge. That is, the base 26 does not overlap the ridges 24a, 24b in a top view. In another embodiment, the base 26 overlaps the right surface 21a and the left surface 21b in a top view. In the right/left side view, the distance between lower surface of the ridges 24a, 24b and the top surface of the base 26 is substantially equal to the thickness T of the connecting pin 3, 4. Therefore, the inserting portion 31 is clipped by the ridge 24a and base 26; the inserting portion 41 is clipped by the ridge 24b and the base 26. The knobs 23a, 23b, 23c, 23d, the ridges 24a, 24b, and the base 26 are cooperatively engaged with the inserting portion 31, 41 of the connecting pin 3, 4. Therefore, the connecting pin 3, 4 can be firmly secured to the support element 2.

The top surface of the inserting portion 31, 41 facing the top surface 21f is not covered by the supporting element 2 and exposed for electrically connecting to the light-emitting device 1. In the left or right side view, the top surface of the inserting portion 31, 41 is substantially coplanar with the top surface 21f of the supporting element 2 between the ridges 24a and 24b. In an embodiment, the light-emitting device 1 is disposed on the supporting element 2 and bonded to the inserting portion 31, 41 without wires, which is sometimes called a "flip chip" bonding. The inserting portion 31, 41 is placed and exposed in a position corresponding to the conductive pads of the light-emitting device 1. The stopper 22 preferably has a sufficient width for insulating the conductive pads of the light-emitting device 1 for preventing short circuit. The light-emitting device 1 electrically connects to the inserting portion 31, 41 of the connecting pin 3, 4 by solder paste, and the stopper 22 provides a buffer area for blocking the spillover of the soldering material. The area of the upper surface of the inserting portion 31 or 41 can be larger than, equivalent to, or smaller than the corresponding conductive pad of light-emitting device 1. In an embodiment, the area of the upper surface of inserting portion 31 or 41 is larger than that of the corresponding conductive pads of light-emitting device 1 to enhance the bonding strength between the light-emitting device 1 and the connecting pin 3, 4. In another embodiment, the light-emitting device 1 electrically connects to the inserting portion 31, 41 of the connecting pins 3, 4 by wire bonding.

The supporting element 2 is an insulating material and made of one or more kinds of thermosetting materials or one or more kinds of thermoplastic materials. Thermosetting material includes but not limited to epoxy resin, silicone resin, and phenol resin. Thermoplastic material includes but not limited to acrylonitrile butadiene styrene (ABS), polycarbonates, polyamides, liquid crystal polymer, and polyester. Polyamides is such as polyphthalamide (PPA). Polyester is such as polybutylene terephthalate (PBT) and polycyclohexylenedimethylene terephthalate (PCT). The supporting element 2 has good thermal conductivity and benefits the light-emitting device 1 by the heat dissipation to the environment.

Referring to FIG. 1D, the stopper 22 has a thickness T1 less than 1/10 of the length of the supporting element 2 (L2), for example, L2=4 mm and T1=0.25 mm. The ridges 24a, 24b have a thickness T2 less than 1/5 of length of the supporting element 2 (L2), for example, L2=4 mm and T2=0.5 mm. The stopper 22 is separated from the ridge 24a or 24b by a distance D (in a top view, as shown in FIG. 1D), 1/4<D/L2<1/2, for example, D=1.4 mm, L2=4 mm. The supporting element 2 has a thickness T3, 1/10<T3/W1<1/4, and 0.9 mm<T3<3 mm; for example, T3=0.5 mm.

Figure 2C:
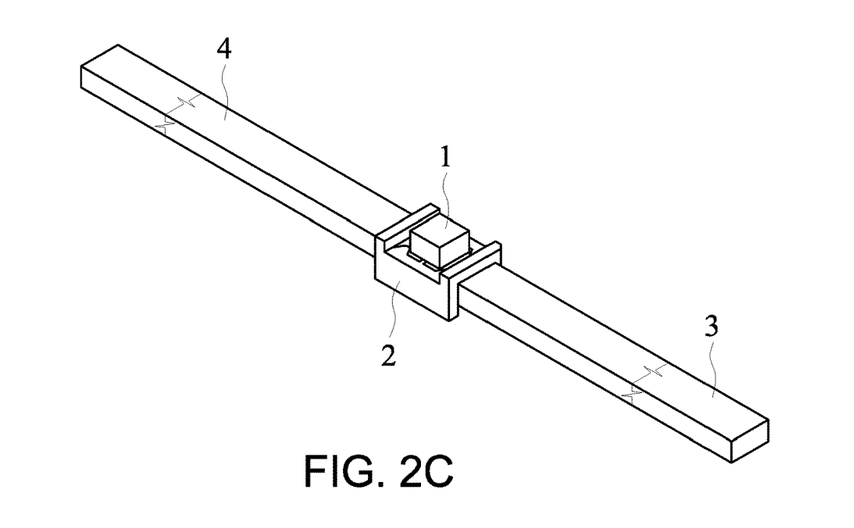
Figure 2D:
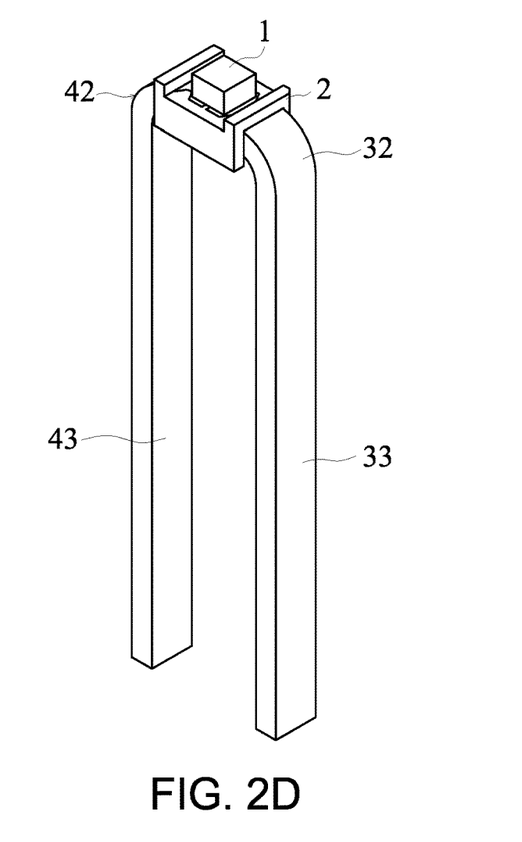

FIGS. 2A-2D show steps of manufacturing a light-emitting apparatus in accordance with an embodiment of the present disclosure. As shown in FIG. 2A, connecting pins 3, 4 with the notches 34a, 34b, 44a, 44b are provided. The connecting pin is preferably made a plate which can be bended in following step(s). The notch is formed on the connecting pin by etching, molding, or cutting. As shown is FIG. 2B, inserting portions 31, 41 of the connecting pins 3, 4 are placed in a mold (not shown). The supporting element 2 is formed by injection molding or compression molding. Hence, the connecting pin 3, 4 and the supporting element 2 are integrated with each other. As shown in FIG. 2C, the light-emitting device 1 is disposed on the supporting element 2 by surface mount technology. Then, as shown in FIG. 2D, the connecting pin 3, 4 are bended to form the bending portion 32, 42 and extending portion 33, 43.

Figure 3:
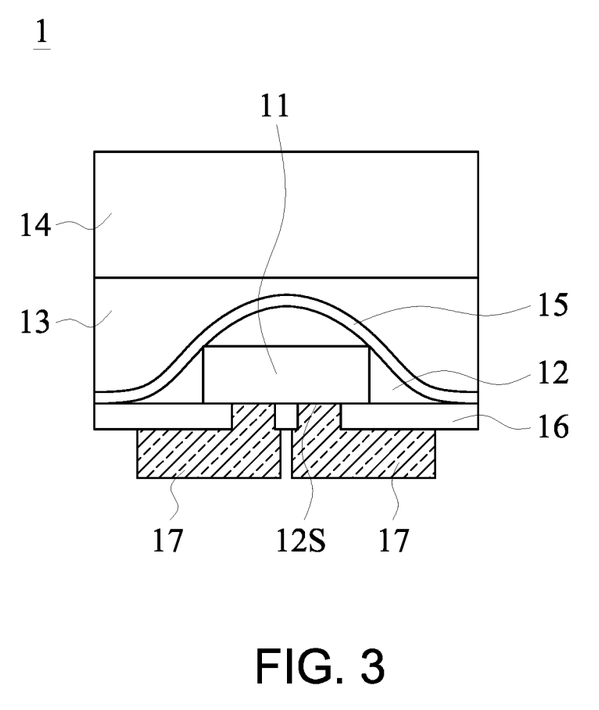
FIG. 3 shows a cross-sectional view of a light-emitting device in accordance with an embodiment of the present disclosure.

FIG. 3 illustrates a cross-section of an exemplified light-emitting device 1 in accordance with an embodiment of the present disclosure. The light-emitting device 1 includes a light-emitting diode 11, a first transparent part 12 arranged on the light-emitting diode 11, a second transparent part 13 arranged on the first transparent part 12, a third transparent part 14 arranged on the second transparent part 13, and a wavelength conversion layer 15 arranged between the first transparent part 12 and the second transparent part 13. The light-emitting diode 11 includes a first semiconductor layer, an active layer, and a second semiconductor layer (not shown). The first semiconductor layer and the second semiconductor layer may include cladding layers and/or confinement layers which can provide the electrons and holes to recombine in the active layer for emitting light (not shown). The first semiconductor layer, the active layer and the second semiconductor layer can be composed of a III-V semiconductor material, such as $Al_xIn_yGa_{(1-x-y)}N$ or $Al_xIn_yGa_{(1-x-y)}P$, wherein $0 \leq x$, $y \leq 1$ and $(x+y) \leq 1$. Depending on the material of the active layer, the light-emitting diode 11 may graduate red light having a wavelength ranged between 610 nm~650 nm, green light having a wavelength ranged between 530 nm~570 nm, or blue light having a wavelength ranged between 450 nm~490 nm. The wavelength conversion layer 15 can include a matrix and a plurality of wavelength conversion particles dispersed in the matrix to absorb and convert a first light from the light-emitting diode 11 into a second light with a peak wavelength or dominant wavelength different from that the first light. The matrix includes silicone-based material or epoxy-based material, and has a refractive index (n) of 1.4~1.6 or 1.5~1.6. The wavelength conversion particles include inorganic phosphor, organic fluorescent colorants, semiconductors, or a combination thereof. The inorganic phosphor includes yellow-greenish phosphor, red phosphor, or blue phosphor. The yellow-greenish phosphor includes YAG, TAG, silicate, vanadate, alkaline-earth metal selenide, or metal nitride. The red phosphor includes fluoride (K2TiF6:Mn4+, K2SiF6:Mn4+), silicate, vanadate, alkaline-earth metal sulfide, oxynitride, or a mixture of tungstate and molybdate. The blue phosphor includes BaMgAl10O17:Eu2+. The quantum dot material can be selected from the group consisting of ZnS, ZnSe, ZnTe, ZnO, CdS, CdSe, CdTe, GaN, GaP, GaSe, GaSb, GaAs, AlN, AlP, AlAs, InP, InAs, Te, PbS, InSb, PbTe, PbSe, SbTe, ZnCdSeS, CuInS, CsPbCl3, CsPbBr3, CsPbI3. The light-emitting device 1 can further includes a reflective layer 16 disposed on a surface 12S of the light-emitting diode 11, and a pair of conductive pad 17 covering the reflective layer 16 and a part of the surface 12S of the light-emitting diode 11. The light generated by the light-emitting device 1 can move upward and sideward.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A light-emitting apparatus, comprising:
   a supporting element comprising an insulating material and a side surface;

a light-emitting device comprising a top surface and a pair of conductive pads, and disposed on the supporting element; and a connecting pin inserted from the side surface and electrically connected to one of the conductive pads, wherein the supporting element comprises a topmost surface lower than the top surface.

2. A light-emitting apparatus according to claim 1, wherein a height ratio of the light-emitting apparatus to the supporting element is of about 5~15.

3. A light-emitting apparatus according to claim 1, wherein a width ratio of the supporting element to the connecting pin is of about 2~10.

4. A light-emitting apparatus according to claim 1, wherein the supporting element comprises a ridge formed around the side surface.

5. A light-emitting apparatus according to claim 1, wherein the light-emitting device comprises a bottom surface on which the pair of the conductive pads are formed.

6. A light-emitting apparatus according to claim 1, wherein the light-emitting device is bonded to the connecting pin without wires.

7. A light-emitting apparatus according to claim 1, wherein the light-emitting device is disposed on the supporting element by surface mount technology.

8. A light-emitting apparatus according to claim 1, wherein the supporting element comprises a thermosetting material or a thermoplastic material.

9. A light-emitting apparatus according to claim 1, wherein the connecting pin is made of a flexible metal material.

10. A light-emitting apparatus according to claim 1, wherein the connecting pin is made of brass with Ni-plated, phosphor bronze with Al-plated, or combination thereof.

11. A light-emitting apparatus according to claim 1, wherein the connecting pin comprises an inserting portion, an extending portion, and a bending portion bridging the inserting portion and the extending portion, and the inserting portion is substantially perpendicular to the extending portion.

12. A light-emitting apparatus according to claim 11, wherein the inserting portion comprises a top surface exposed out of the supporting element for bonding with one of the conductive pads.

13. A light-emitting apparatus according to claim 11, wherein the inserting portion comprises a lateral side and a notch formed on the lateral side.

14. A light-emitting apparatus according to claim 11, wherein the supporting element comprises an empty space substantially complementary to the inserting portion.

15. A light-emitting apparatus according to claim 14, wherein the supporting element comprises a knob arranged in the empty space.

16. A light-emitting apparatus according to claim 15, wherein the inserting portion comprises a lateral side and a notch formed on the lateral side, the knob is substantially complementary to the notch.

* * * * *